United States Patent
Kao

(10) Patent No.: US 11,309,253 B2
(45) Date of Patent: Apr. 19, 2022

(54) PACKAGE STRUCTURE AND METHOD FOR MANUFACTURING THE SAME

(71) Applicant: Advanced Semiconductor Engineering, Inc., Kaohsiung (TW)

(72) Inventor: Chin-Li Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/858,269

(22) Filed: Apr. 24, 2020

(65) Prior Publication Data

US 2021/0335715 A1    Oct. 28, 2021

(51) Int. Cl.
| | |
|---|---|
| H01L 23/538 | (2006.01) |
| H01L 21/66 | (2006.01) |
| H01L 21/48 | (2006.01) |
| H01L 21/56 | (2006.01) |
| H01L 23/31 | (2006.01) |

(52) U.S. Cl.
CPC ...... H01L 23/5385 (2013.01); H01L 21/4857 (2013.01); H01L 21/561 (2013.01); H01L 22/14 (2013.01); H01L 23/3128 (2013.01); H01L 23/5383 (2013.01); H01L 23/5389 (2013.01)

(58) Field of Classification Search
CPC ............ H01L 23/5385; H01L 21/4857; H01L 21/561; H01L 22/14; H01L 23/3128; H01L 23/5383; H01L 23/5389
See application file for complete search history.

(56) References Cited

U.S. PATENT DOCUMENTS

| | | | |
|---|---|---|---|
| 9,653,391 B1 * | 5/2017 | Yew | H01L 23/5389 |
| 2016/0276307 A1 * | 9/2016 | Lin | H01L 23/552 |
| 2017/0084596 A1 * | 3/2017 | Scanlan | H01L 21/4882 |
| 2020/0294912 A1 * | 9/2020 | Tai | H01L 23/5283 |
| 2021/0118770 A1 * | 4/2021 | Kuo | H01L 23/49816 |

OTHER PUBLICATIONS

U.S. Appl. No. 16/703,454, filed Dec. 4, 2019, Advanced Semiconductor Engineering, Inc.

* cited by examiner

*Primary Examiner* — Fernando L Toledo
*Assistant Examiner* — Neil R Prasad
(74) *Attorney, Agent, or Firm* — Foley & Lardner LLP

(57) ABSTRACT

A package structure and a method for manufacturing a package structure are provided. The package structure includes a first conductive structure and a second conductive structure. The first conductive structure includes at least one dielectric layer and at least one circuit layer in contact with the dielectric layer. The second conductive structure is bonded to the first conductive structure. The second conductive structure includes at least one dielectric layer and at least one circuit layer in contact with the dielectric layer. A distribution density of the circuit layer of the first conductive structure is greater than a distribution density of the circuit layer of the second conductive structure. A size of the second conductive structure is less than a size of the first conductive structure.

24 Claims, 14 Drawing Sheets

PACKAGE STRUCTURE AND METHOD FOR MANUFACTURING THE SAME

BACKGROUND

1. Field of the Disclosure

The present disclosure relates to a package structure, and a manufacturing method, and to a package structure including at least two conductive structures that are attached or bonded together and including circuit layers having different distribution densities, and a method for manufacturing the same.

2. Description of the Related Art

Along with the rapid development in electronics industry and the progress of semiconductor processing technologies, semiconductor chips are integrated with an increasing number of electronic components to achieve better electrical performance and more functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase. Thus, thickness of the semiconductor substrate may correspondingly increase, and yield of the semiconductor substrate may decrease.

SUMMARY

In some embodiments, a package structure includes a first conductive structure and a second conductive structure. The first conductive structure includes at least one dielectric layer and at least one circuit layer in contact with the dielectric layer. The second conductive structure is bonded to the first conductive structure. The second conductive structure includes at least one dielectric layer and at least one circuit layer in contact with the dielectric layer. A distribution density of the circuit layer of the first conductive structure is greater than a distribution density of the circuit layer of the second conductive structure. A size of the second conductive structure is less than a size of the first conductive structure.

In some embodiments, a package structure includes a first conductive structure, a second conductive structure, and a protection layer. The first conductive structure includes at least one dielectric layer and at least one circuit layer in contact with the dielectric layer. The second conductive structure is bonded to the first conductive structure. The second conductive structure includes at least one dielectric layer and at least one circuit layer in contact with the dielectric layer. A distribution density of the circuit layer of the first conductive structure is greater than a distribution density of the circuit layer of the second conductive structure. The protection layer is between the first conductive structure and the second conductive structure. A portion of the protection layer extends along a lateral peripheral surface of the second conductive structure.

In some embodiments, a method for manufacturing a package structure includes the following operations: (a) forming a first conductive structure including at least one dielectric layer and at least one circuit layer in contact with the dielectric layer, wherein the first conductive structure further includes at least one unit; (b) forming at least one second conductive structure including at least one dielectric layer and at least one circuit layer in contact with the dielectric layer, wherein a distribution density of the circuit layer of the first conductive structure is greater than a distribution density of the circuit layer of the second conductive structure, and a size of the second conductive structure is less than a size of the unit of the first conductive structure; and (c) bonding the at least one second conductive structure to the unit of the first conductive structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
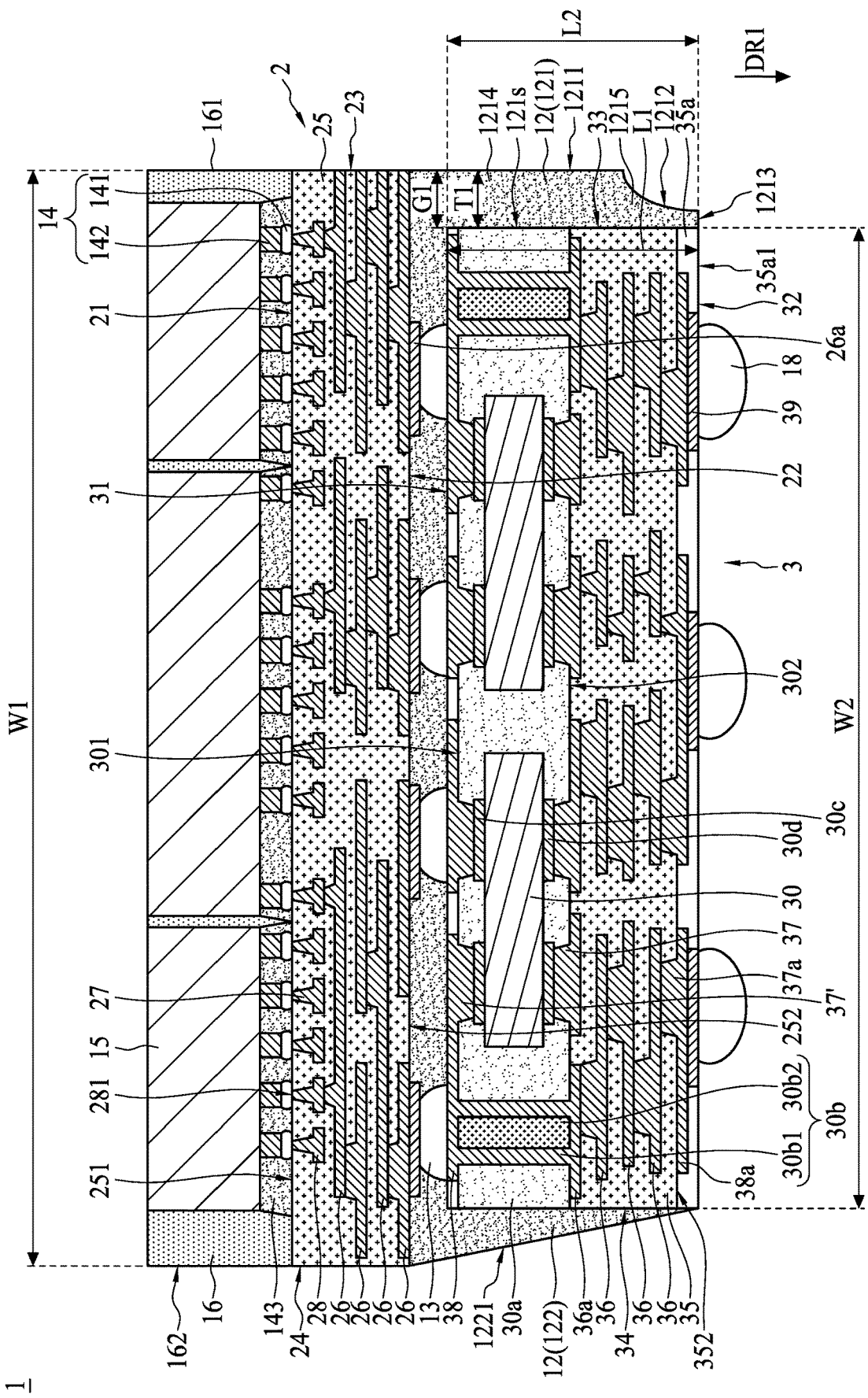
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a package structure 1 according to some embodiments of the present disclosure. The package structure 1 includes a first conductive structure 2, a second conductive structure 3, a protection layer 12, at least one conductive connecting element 13, at least one semiconductor device 15, and an encapsulant 16.

The first conductive structure 2 may include a dielectric structure 25 and at least one circuit layer (including, for example, circuit layers 26 and 28 formed of a metal, a metal alloy, or other conductive material). The dielectric structure 25 may include at least one dielectric layer, and the at least one circuit layer may be in contact with the at least one dielectric layer. In some embodiments, the dielectric structure 25 may be made of a cured photoimageable dielectric (PID) material such as epoxy or polyimide (PI) including photoinitiators. In addition, the dielectric structure 25 may include no fibers (e.g., glass fibers). In some embodiments, the first conductive structure 2 may be referred to as "a stacked structure" or "a high-density conductive structure" or "a high-density stacked structure". In some embodiments, a distribution density of a circuit layer of the high-density conductive structure (e.g., the first conductive structure 2) is greater than a distribution density of a circuit layer of a low-density conductive structure (e.g., the second conductive structure 3). In some embodiments, the circuit layer (including, for example, the circuit layers 26 and 28) of the first conductive structure 2 may be also referred to as "a high-density circuit layer". In some embodiments, a distribution density of a circuit line (including, for example, a trace or a pad) of the high-density circuit layer is greater than a distribution density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

In some embodiments, the first conductive structure 2 may be a bumping level redistribution structure. The circuit layers 26 and 28 may be fan-out circuit layers or redistribution layers (RDLs), and an L/S of the circuit layers 26 and 28 may be less than or equal to about 10 µm/about 10 about 5 µm/about 5 about 2 µm/about 2 or less than or equal to about 1.8 µm/about 1.8 In some embodiments, the circuit layers 26 and 28 are embedded in the dielectric structure 25. In some embodiments, the top surface 281 of the circuit layer 28 may be substantially coplanar with the top surface 251 of the dielectric structure 25. In some embodiments, the circuit layers 26 include horizontally connecting or extending circuit layers.

The first conductive structure 2 may further include a plurality of inner vias 27. In some embodiments, some of the inner vias 27 are disposed between two adjacent circuit layers 26 for electrically connecting the two circuit layers 26. In some embodiments, some of the inner vias 27 are disposed between the circuit layer 26 and the circuit layer 28 for electrically connecting the circuit layer 26 and the circuit layer 28. In some embodiments, each inner via 27 and the corresponding circuit layer 26 may be formed integrally as a monolithic or one-piece structure. In some embodiments, each inner via 27 and the corresponding circuit layer 28 may be formed integrally as a monolithic or one-piece structure. Each inner via 27 tapers upwardly along a direction from the bottom surface 252 towards the top surface 251 of the dielectric structure 25. That is, a size (e.g., a width) of a top portion of the inner via 27 is less than a size (e.g., a width) of a bottom portion of the inner via 27 that is closer towards the bottom surface 252.

As shown in FIG. 1, the first conductive structure 2 has a top surface 21 (also referred to as "a first surface"), a bottom surface 22 (also referred to as "a second surface") opposite to the top surface 21, and a plurality of lateral peripheral surfaces 23, 24 extending between the top surface 21 and the bottom surface 22. The bottom surface 22 faces the second conductive structure 3. In some embodiments, the top surface 251 of the dielectric structure 25 forms a portion of the top surface 21 of the first conductive structure 2. In some embodiments, the bottom surface 252 of the dielectric structure 25 forms a portion of the bottom surface 22 of the first conductive structure 2.

The second conductive structure 3 is bonded to the first conductive structure 2. The second conductive structure 3 may include a dielectric structure 35, at least one circuit layer (including, for example, circuit layers 36, 36a, 38 and 38a formed of a metal, a metal alloy, or other conductive material). The dielectric structure 35 may include at least one dielectric layer, and the at least one circuit layer may be in contact with the at least one dielectric layer. In some embodiments, the dielectric structure 35 may be made of, for example, polypropylene (PP) or ajinomoto build-up film (ABF). In some embodiments, a plurality of fibers (e.g., glass fibers) may be embedded in the dielectric layer of the dielectric structure 35 to improve the material strength of the dielectric structure 35.

In some embodiments, the second conductive structure 3 may be referred to as "a stacked structure" or "a low-density conductive structure" or "a low-density stacked structure". In some embodiments, the circuit layer (including, for example, the circuit layers 36, 36a, 38 and 38a) of the second conductive structure 3 may be also referred to as "a low-density circuit layer". In some embodiments, a distribution density of a circuit line (including, for example, a trace or a pad) of the high-density circuit layer is greater than a distribution density of a circuit line of the low-density circuit layer. In some embodiments, a distribution density of a circuit layer of the first conductive structure 2 is greater than a distribution density of a circuit layer of the second conductive structure 3.

In some embodiments, the second conductive structure 3 may be a substrate level conductive structure. In some embodiments, an L/S of the circuit layer (for example, the circuit layers 36, 36a, 38 and 38a) of the second conductive structure 3 may be greater than or equal to about 10 µm/about 10 µm. Thus, the L/S of the circuit layer (for example, the circuit layers 36, 36a, 38 and 38a) of the second conductive structure 3 may be greater than or equal to about five times the L/S of the circuit layers (for example, circuit layers 26 and 28) of the first conductive structure 2.

In some embodiments, the second conductive structure 3 may further include a core portion 30a. In some embodiments, the core portion 30a of the second conductive structure 3 may include a resin material, and optionally further include a reinforcement element such as glass fiber. Alternatively, the core portion 30a of the second conductive structure 3 may include only a homogeneous resin. In addition, a material of the core portion 30a may include Ajinomoto build-up film (ABF), bismaleimide-triazine (BT) or epoxy resin.

In some embodiments, the second conductive structure 3 may further include at least one interconnection via 30b extending through the core portion 30a for vertical connection. In some embodiments, each interconnection via 30b includes a base metallic layer 30b1 and an insulation material 30b2, and the insulation material 30b2 fills the central through hole defined by the base metallic layer 30b1. In some embodiments, the circuit layer 38 is disposed on the top surface 301 of the core portion 30a, the circuit layer 36a is disposed on the bottom portion 302 of the core portion 30a, and each interconnection via 30b electrically connects the circuit layer 38 and the circuit layer 36a.

In some embodiments, the second conductive structure 3 may further include at least one electronic device 30. In some embodiments, the electronic device 30 is embedded in the core portion 30a of the second conductive structure 3. In some embodiments, the electronic device 30 may be or include a passive component, such as a capacitor, an inductor, a resistor or the like.

In some embodiments, the second conductive structure 3 may further include at least one inner via (including, for example, interconnection vias 37, 37' and 37a). In some embodiments, some of the interconnection vias 37' are disposed between the circuit layer 38 and the electronic device 30 for electrically connecting the circuit layer 38 and the electronic device 30. A conductive bump 30c may be disposed between the interconnection via 37' and the electronic device 30 for electrically connecting the interconnection via 37' and the electronic device 30. In some embodiments, some of the interconnection vias 37 are disposed between the circuit layer 36a and the electronic device 30 for electrically connecting the circuit layer 36a and the electronic device 30. A conductive bump 30d may be disposed between the interconnection via 37 and the electronic device 30 for electrically connecting the interconnection via 37 and the electronic device 30. In some embodiments, some of the interconnection vias 37 are disposed between the circuit layer 36a and the circuit layer 36 for electrically connecting the circuit layer 36a and the circuit layer 36. In some embodiments, some of the interconnection vias 37 are disposed between two adjacent circuit layers 36 for electrically connecting the two adjacent circuit layers 36. In some embodiments, some of the interconnection vias 37a are disposed between the circuit layer 36 and the circuit layer 38a for electrically connecting the circuit layer 36 and the circuit layer 38a.

As shown in FIG. 1, the second conductive structure 3 has a top surface 31 (also referred to as "a first surface"), a bottom surface 32 (also referred to as "a second surface") opposite to the top surface 31 and a plurality of lateral peripheral surfaces 33, 34 extending between the top surface 31 and the bottom surface 32. In some embodiments, the second conductive structure 3 further includes a solder mask 35a adjacent to the bottom surface 32 of the second conductive structure 3. In some embodiments, the solder mask 35a is disposed on the bottom surface 352 of the dielectric structure 35. In some embodiments, as shown in FIG. 1, the circuit layer 38a is disposed on and protrudes from the bottom surface 352 of the dielectric structure 35 of the second conductive structure 3. In some embodiments, the solder mask 35a covers a portion of the dielectric structure 35 and a portion of the circuit layer 38a, and defines a plurality of openings to expose portions of the circuit layer 38a.

In some embodiments, a size of the second conductive structure 3 (also referred to as "a low-density conductive structure") is less than a size of the first conductive structure 2 (also referred to as "a high-density conductive structure"). In some embodiments, a width W2 of the second conductive structure 3 is less than a width W1 of the first conductive structure 2. In some embodiments, a surface area of the top surface 31 of the second conductive structure 3 is less than a surface area of the bottom surface 22 of the first conductive structure 2 from a top view.

In some embodiments, the lateral peripheral surface 33 (also referred to as "a first lateral peripheral surface") of the second conductive structure 3 is recessed from or misaligned with the lateral peripheral surface 23 (also referred to as "a first lateral peripheral surface") of the first conductive structure 2 by a gap G1. In some embodiments, the lateral peripheral surface 33 of the second conductive structure 3 and the lateral peripheral surface 23 of the first conductive structure 2 are facing the same direction. In some embodiments, the gap G1 formed between the lateral peripheral surface 33 of the second conductive structure 3 and the lateral peripheral surface 23 of the first conductive structure 2 is equal to or less than about 75 µm, or equal to or less than about 50 µm.

The conductive connecting element 13 is disposed between the second conductive structure 3 and the first conductive structure 2 and bonding the second conductive structure 3 and the first conductive structure 2 together. A bonding pad 26a may be disposed between the circuit layer 26 and the conductive connecting element 13 for electrically connecting the circuit layer 26 and the conductive connecting element 13. In some embodiments, the conductive connecting element 13 may be or include solder bumps or other conductive bumps.

In some embodiments, the protection layer 12 may be or include an underfill. The protection layer 12 is disposed in a space between the first conductive structure 2 and the second conductive structure 3 to cover and protect the conductive connecting element 13. In some embodiments, the protection layer 12 includes a portion 121 (also referred to as "a first portion"), and the portion 121 of the protection layer 12 extends along the lateral peripheral surface 33 of the second conductive structure 3. In some embodiments, the portion 121 of the protection layer 12 directly contacts the lateral peripheral surface 33 of the second conductive structure 3 at an interface 121s, and the interface 121s has a length L1. In some embodiments, the lateral peripheral surface 33 of the second conductive structure 3 has a length L2. In some embodiments, the length L1 of the interface 121s may be equal to or less than the length L2 of the lateral peripheral surface 33 of the second conductive structure 3.

In some embodiments, as shown in FIG. 1, the portion 121 of the protection layer 12 tapers along a direction DR1 from the top surface 31 (also referred to as "the first surface") of the second conductive structure 3 facing the first conductive structure 2 towards the bottom surface 32 (also referred to as "the second surface") of the second conductive structure 3 opposite to the top surface 31. In some embodiments, as shown in FIG. 1, a lateral peripheral surface 1211 of the portion 121 of the protection layer 12 is substantially coplanar with the lateral peripheral surface 23 of the first conductive structure 2. In some embodiments, a bottom surface 1213 of the portion 121 of the protection layer 12 is substantially coplanar with the bottom surface 32 of the second conductive structure 3. In some embodiments, the portion 121 of the protection layer 12 further has a curved surface 1212 extending between the lateral peripheral surface 1211 and the bottom surface 1213. In some embodiments, the curved surface 1212 is concave towards the lateral peripheral surface 33 of the second conductive structure 3. In some embodiments, the portion 121 of the protection layer 12 directly contacts the solder mask 35a. In some embodiments, the bottom surface 1213 of the portion 121 of the protection layer 12 is substantially coplanar with the bottom surface 35a1 of the solder mask 35a.

In some embodiments, the second conductive structure 3 further has a lateral peripheral surface 34 (also referred to as "a second lateral peripheral surface") opposite to the lateral peripheral surface 33. In some embodiments, the protection layer 12 further includes a portion 122 (also referred to as "a second portion"), and the portion 122 of the protection layer 12 extends along the lateral peripheral surface 34 of the second conductive structure 3. In some embodiments, the portion 122 of the protection layer 12 directly contacts the lateral peripheral surface 34 of the second conductive structure 3. In some embodiments, as shown in FIG. 1, the portion 122 of the protection layer 12 tapers along the direction DR1 from the top surface 31 of the second conductive structure 3 towards the bottom surface 32 of the second conductive structure 3. In some embodiments, the portion 122 of the protection layer 12 has a lateral peripheral surface 1221, and the lateral peripheral surface 1221 is a slanted surface. In some embodiments, the lateral peripheral surface 1221 extends between a lateral peripheral surface 24 of the first conductive structure 2 and the bottom surface 32 of the second conductive structure 3.

In some embodiments, as shown in FIG. 1, a profile of the portion 121 of the protection layer 12 is different from a profile of the portion 122 of the protection layer 12. For example, the portion 121 of the protection layer 12 may include a main portion 1214 and a taper portion 1215. The main portion 1214 may have a substantially consistent thickness T1. The thickness T1 may be substantially equal to the gap G1. For example, the thickness T1 of the main portion 1214 may be equal to or less than about 75 μm, or equal to or less than about 50 μm. The main portion 1214 may have the flat lateral peripheral surface 1211, and the taper portion 1215 may have the curved surface 1212. That is, the taper portion 1215 may have a decreasing thickness from the main portion 1214 to the bottom surface 1213 of the portion 121 of the protection layer 12. In addition, the taper portion 1215 may be a substantially right-angled triangle. As shown in FIG. 1, the taper portion 1215 may have a decreasing thickness from the bottom surface 22 of the first conductive structure 2 to the bottom surface 32 of the second conductive structure 3.

The semiconductor device 15 is electrically connected to the first conductive structure 2. In some embodiments, at least one conductive connecting element 14 is disposed between the semiconductor device 15 and the first conductive structure 2 to connect the semiconductor device 15 and the first conductive structure 2. In some embodiments, the conductive connecting element 14 may include a solder 141 and a bump 142 connected to the solder 141. The conductive connecting element 14 is disposed between the semiconductor device 15 and the inner via 27 to connect semiconductor device 15 and the inner via 27, to further connect to the circuit layer 28 of the first conductive structure 2. In some embodiments, an underfill 143 is formed between the semiconductor device 15 and the top surface 21 of the first conductive structure 2 to cover the conductive connecting element 14. In some embodiments, a material of the underfill 143 and a material of the protection layer 12 may be the same. In some embodiments, the semiconductor device 15 may be or include an active component such as an application specific IC (ASIC), a memory component such as a high bandwidth memory (HBM) component or another active component. In some embodiments, as shown in FIG. 1, the package structure 1 includes three semiconductor devices 15, but the present disclosure is not limited thereto.

The encapsulant 16 encapsulates the semiconductor device 15. In some embodiments, a lateral peripheral surface 161 (also referred to as "a first lateral peripheral surface") of the encapsulant 16 is substantially coplanar with the lateral peripheral surface 23 of the first conductive structure 2. In some embodiments, the lateral peripheral surface 161 of the encapsulant 16 is substantially coplanar with the lateral peripheral surface 1211 of the portion 121 of the protection layer 12. In some embodiments, the encapsulant 16 further has a lateral peripheral surface 162 (also referred to as "a second lateral peripheral surface") opposite to the lateral peripheral surface 161. In some embodiments, the lateral peripheral surface 162 of the encapsulant 16 is substantially coplanar with the lateral peripheral surface 24 of the first conductive structure 2. In some embodiments, the encapsulant 16 may be or include a molding compound.

In some embodiments, the package structure 1 may further include at least one conductive connecting element 18 on the bottom surface 32 of the second conductive structure 3. In some embodiments, a UBM 39 is between the conductive connecting element 18 and the exposed portion of the circuit layer 38a for electrically connecting the conductive connecting element 18 and the circuit layer 38a. In some embodiments, the conductive connecting element 18 may be or include solder bumps or other conductive bumps.

In the cases where substrate(s) and fan-out structure(s) are bonded together by an adhesion layer, and electrical connections between the substrate(s) and the fan-out structure(s) are conductive vias that are manufactured by laser technique, the I/O counts may be too low (for example, lower than 10000 I/O counts) due to the relatively large sizes (e.g., 50-60 μm or above) of the conductive vias formed by laser technique. Further, the laser drilling process may be costly. According to some embodiments of the present disclosure, the first conductive structure 2 and the second conductive structure 3 are bonded together by, for example, solder joint technique (for example, using the conductive connecting elements 13), such that the manufacture of conductive vias by such laser technique may be omitted, and thus the low I/O density (low I/O counts) issue due to the relatively large sizes of the conductive vias formed by laser technique may be greatly improved.

In addition, to meet the specification of increasing I/O counts, a number of dielectric layers of a substrate should increase, and one circuit layer may be embedded in one corresponding dielectric layer. In some comparative embodiments, if a package has 10000 I/O counts, such substrate may include twelve layers of circuit layers and dielectric layers. The manufacturing cost of such substrate is low, however, the manufacturing yield for one layer (including one circuit layer and one dielectric layer) of such substrate may be also low, for example, 90%. Thus, the yield of such substrate may be $(0.9)^{12}$=28.24%. According to some embodiments of the present disclosure, the package structure 1 is a combination of the first conductive structure 2 and the second conductive structure 3, in which the circuit layers 26 and 28 of the first conductive structure 2 have fine pitch, high yield and low thickness, and the circuit layers (e.g., the circuit layers 36, 36*a*, 38 and 38*a*) of the second conductive structure 3 have low manufacturing cost. Thus, the package structure 1 has an advantageous compromise of yield and manufacturing cost, and the package structure 1 has a relatively low thickness. For example, the manufacturing yield for one layer of the circuit layers 26 and 28 of the first conductive structure 2 may be 99%, and the manufacturing yield for one layer of the circuit layers of the second conductive structure 3 may be 90%. Thus, the yield of the package structure 1 may be improved.

Figure 2:
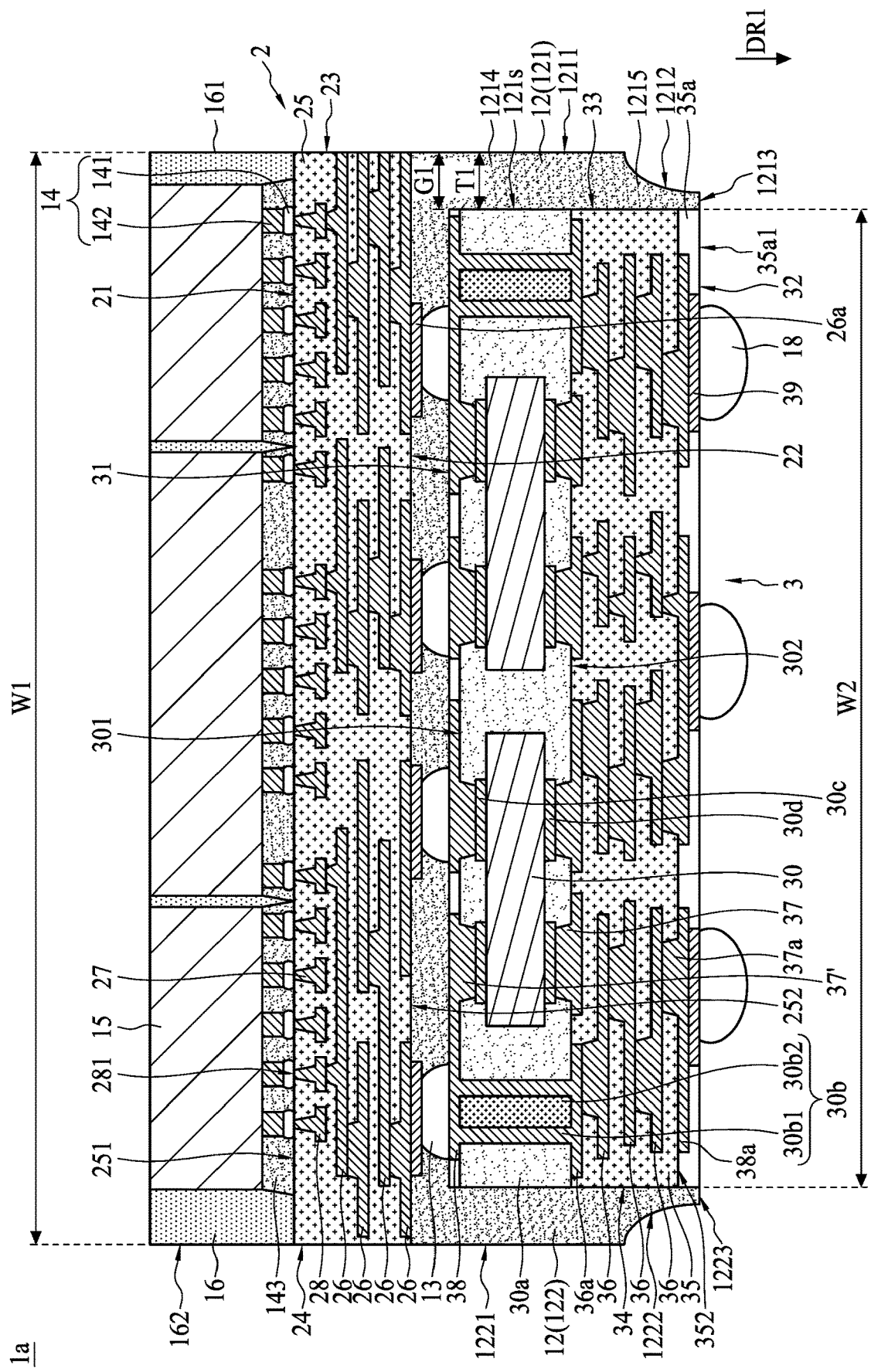
FIG. 2 illustrates a cross-sectional view of a package structure according to some embodiments of the present disclosure.

FIG. 2 illustrates a cross-sectional view of a package structure 1*a* according to some embodiments of the present disclosure. The package structure 1*a* is similar to the package structure 1 shown in FIG. 1, except for a structure of a protection layer 12.

In some embodiments, the profile of the portion 121 of the protection layer 12 is substantially the same as the profile of the portion 122 of the protection layer 12. In some embodiments, the lateral peripheral surface 1221 of the portion 122 of the protection layer 12 is substantially coplanar with the lateral peripheral surface 24 of the first conductive structure 2. In some embodiments, a bottom surface 1223 of the portion 122 of the protection layer 12 is substantially coplanar with the bottom surface 32 of the second conductive structure 3. In some embodiments, the portion 122 of the protection layer 12 further has a curved surface 1222 extending between the lateral peripheral surface 1221 and the bottom surface 1223. In some embodiments, the curved surface 1222 is concave towards the lateral peripheral surface 34 of the second conductive structure 3. In some embodiments, the portion 122 of the protection layer 12 directly contacts the solder mask 35*a*. In some embodiments, the bottom surface 1223 of the portion 122 of the protection layer 12 is substantially coplanar with the bottom surface 35*a*1 of the solder mask 35*a*.

Figure 3:
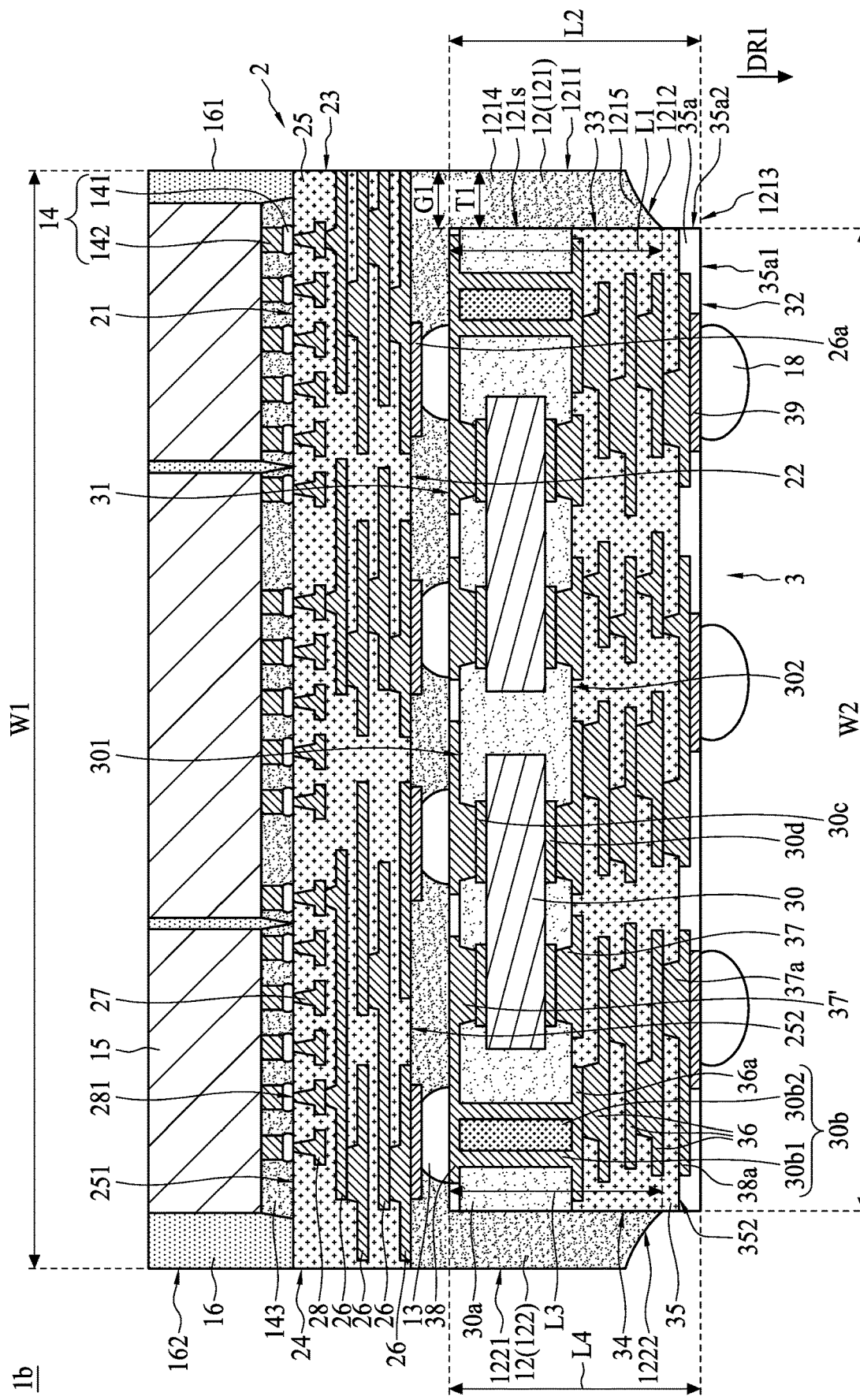
FIG. 3 illustrates a cross-sectional view of a package structure according to some embodiments of the present disclosure.

FIG. 3 illustrates a cross-sectional view of a package structure 1*b* according to some embodiments of the present disclosure. The package structure 1*b* is similar to the package structure 1 shown in FIG. 1, except for a structure of a protection layer 12.

In some embodiments, the portion 121 of the protection layer 12 partially covers the lateral peripheral surface 33 and exposes a portion of the lateral peripheral surface 33. In some embodiments, the portion 122 of the protection layer 12 partially covers the lateral peripheral surface 34 and exposes a portion of the lateral peripheral surface 34.

In some embodiments, the portion 121 of the protection layer 12 directly contacts the lateral peripheral surface 33 of the second conductive structure 3 at an interface 121*s*, and a ratio of the length L1 of the interface 121*s* to the length L2 of the lateral peripheral surface 33 of the second conductive structure 3 is greater than about 0.8. In some embodiments, the portion 122 of the protection layer 12 directly contacts the lateral peripheral surface 34 of the second conductive structure 3 at an interface 121*s*1, and a ratio of the length L3 of the interface 121*s*1 to the length L4 of the lateral peripheral surface 34 of the second conductive structure 3 is greater than about 0.8. In some embodiments, the length L1 of the interface 121*s* may be the equal to or unequal to the length L3 of the interface 121*s*1.

In some embodiments, the solder mask 35*a* has a lateral surface 35*a*2 angled with the bottom surface 35*a*1, and the lateral surface 35*a*2 of the solder mask 35*a* is exposed from the portion 121 of the protection layer 12. In some embodiments, the lateral surface 35*a*2 of the solder mask 35*a* is exposed from the portion 122 of the protection layer 12.

Figure 4:
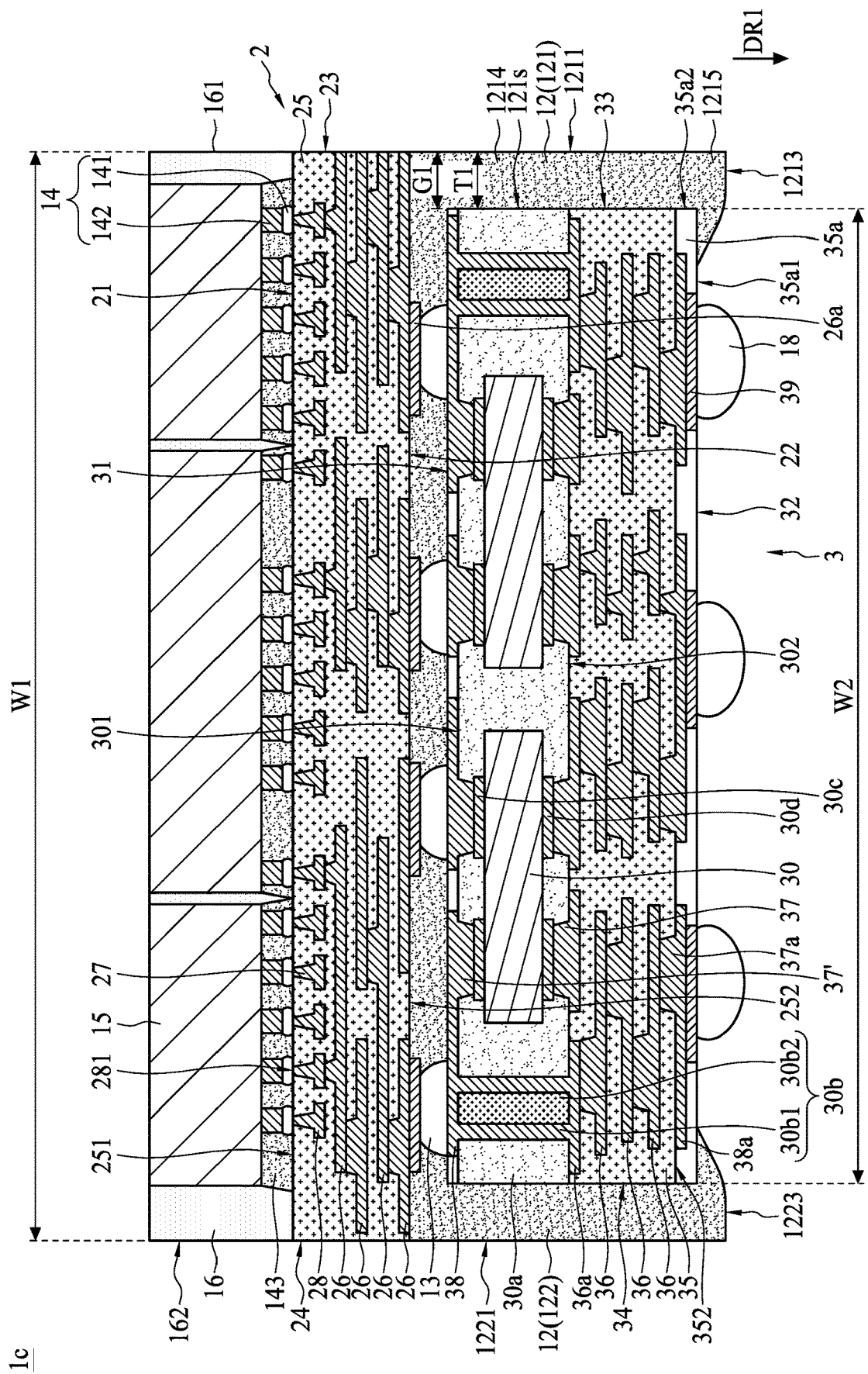
FIG. 4 illustrates a cross-sectional view of a package structure according to some embodiments of the present disclosure.

FIG. 4 illustrates a cross-sectional view of a package structure 1*c* according to some embodiments of the present disclosure. The package structure 1*c* is similar to the package structure 1 shown in FIG. 1, except for a structure of a protection layer 12.

In some embodiments, the portion 121 of the protection layer 12 is protruded from the bottom surface 32 of the second conductive structure 3. In some embodiments, the portion 121 of the protection layer 12 partially covers the bottom surface 32 of the second conductive structure 3. In some embodiments, the bottom surface 1213 of the portion 121 of the protection layer 12 and the bottom surface 32 of the second conductive structure 3 are at different elevations. In some embodiments, the portion 121 of the protection layer 12 is spaced apart from the conductive connecting element 18. In some embodiments, the portion 121 of the protection layer 12 covers the lateral surface 35*a*2 of the solder mask 35*a*. In some embodiments, the portion 121 of the protection layer 12 covers a portion of the bottom surface 35*a*1 of the solder mask 35*a*.

In some embodiments, the portion 122 of the protection layer 12 is protruded from the bottom surface 32 of the second conductive structure 3. In some embodiments, the portion 122 of the protection layer 12 partially covers the bottom surface 32 of the second conductive structure 3. In some embodiments, the bottom surface 1223 of the portion 122 of the protection layer 12 and the bottom surface 32 of the second conductive structure 3 are at different elevations. In some embodiments, the portion 122 of the protection layer 12 is spaced apart from the conductive connecting element 18. In some embodiments, the portion 122 of the protection layer 12 covers the lateral surface 35*a*2 of the solder mask 35*a*. In some embodiments, the portion 122 of the protection layer 12 covers a portion of the bottom surface 35*a*1 of the solder mask 35*a*. In some embodiments, the bottom surface 1213 of the portion 121 of the protection layer 12 and the bottom surface 1223 of the portion 122 of the protection layer 12 may be at the same or different elevations.

Figure 5:
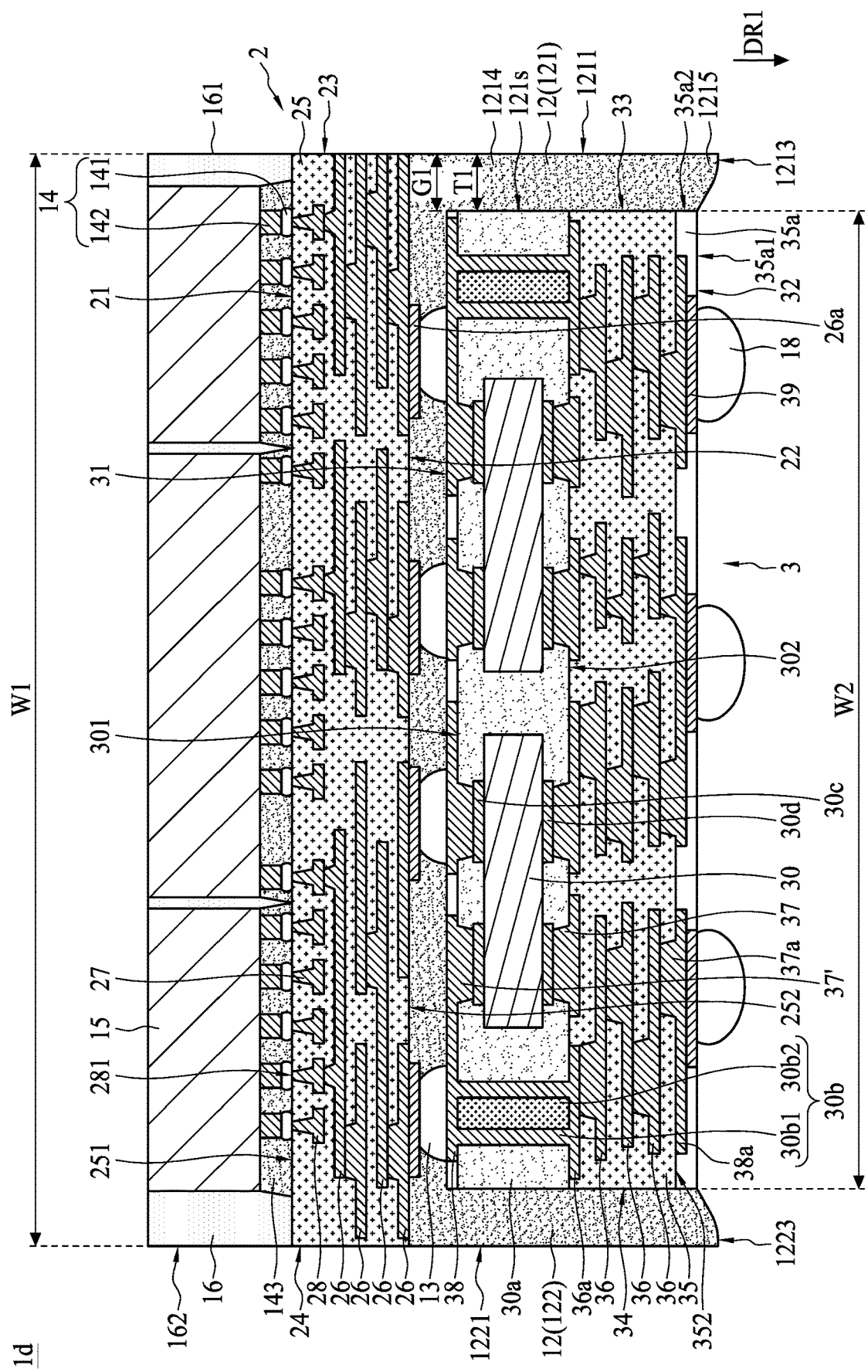
FIG. 5 illustrates a cross-sectional view of a package structure according to some embodiments of the present disclosure.

FIG. 5 illustrates a cross-sectional view of a package structure 1*d* according to some embodiments of the present disclosure. The package structure 1*d* is similar to the package structure 1*c* shown in FIG. 4, except for a structure of a protection layer 12. As shown in FIG. 5, the portion 121 of the protection layer 12 and the portion 122 of the protection layer 12 do not cover or contact the bottom surface 32 of the second conductive structure 3. That is, the portion 121 of the protection layer 12 and the portion 122 of the protection layer 12 do not extend to cover the bottom surface 35a1 of the solder mask 35a.

Figure 6:
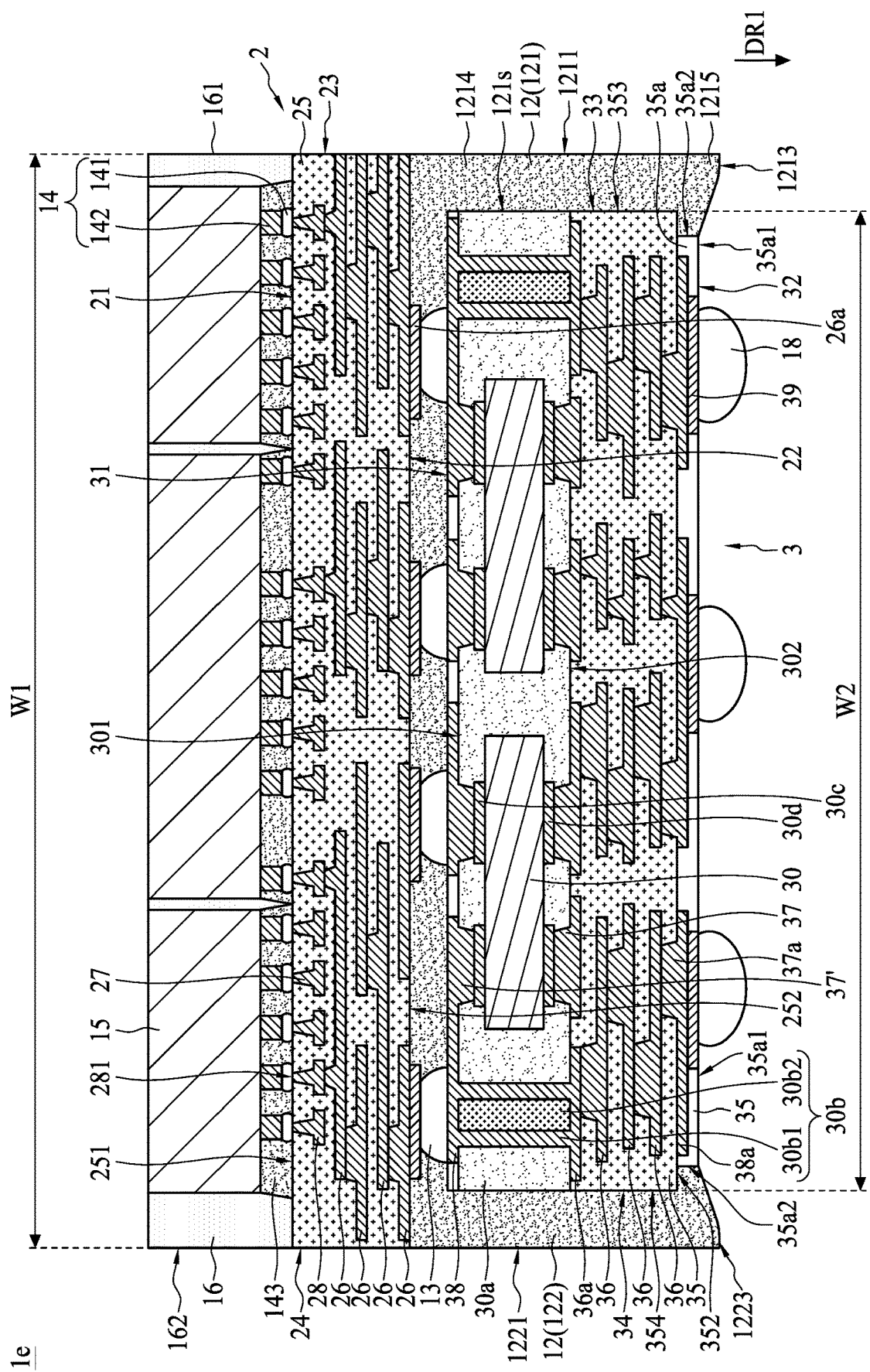
FIG. 6 illustrates a cross-sectional view of a package structure according to some embodiments of the present disclosure.

FIG. 6 illustrates a cross-sectional view of a package structure 1e according to some embodiments of the present disclosure. The package structure 1e is similar to the package structure 1d shown in FIG. 5, except for structures of a protection layer 12 and a solder mask 35a.

In some embodiments, the lateral surfaces 35a2 of the solder mask 35a are recessed from the lateral peripheral surfaces 33, 34 of the second conductive structure 3. In some embodiments, the portions 121, 122 of the protection layer 12 may partially cover or fully cover the lateral surfaces 35a2 of the solder mask 35a. In some embodiments, the bottom surface 35a1 of the solder mask 35a is free from the portions 121, 122 of the protection layer 12. In some embodiments, the bottom surface 1213 of the portion 121 and the bottom surface 1223 of the portion 122 of the protection layer 12 are protruded from the bottom surface 32 of the second conductive structure 3. In some embodiments, the portions 121, 122 of the protection layer 12 directly contact a portion of the bottom surface 352 of the dielectric structure 35.

Figure 7:
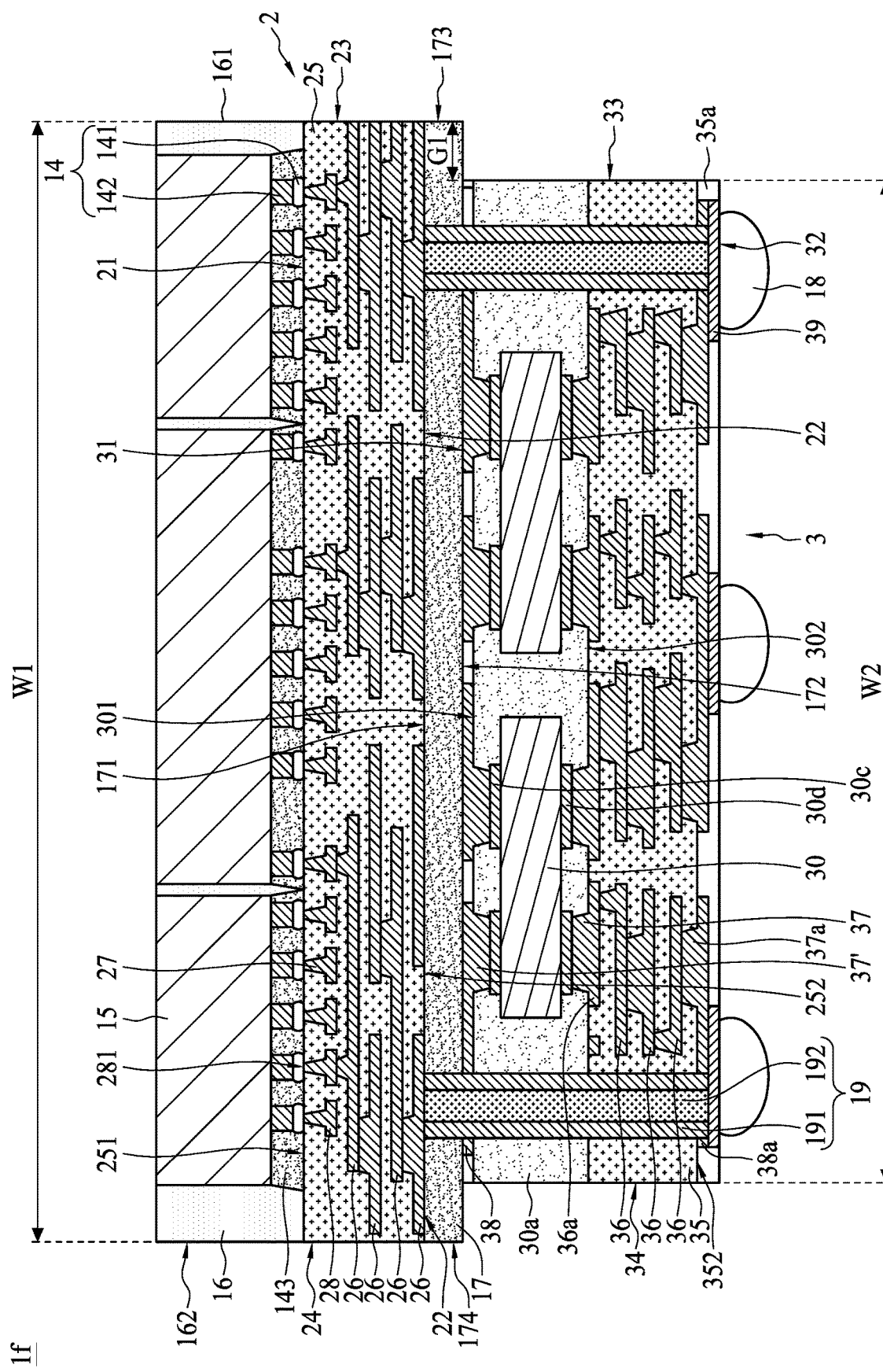
FIG. 7 illustrates a cross-sectional view of a package structure according to some embodiments of the present disclosure.

FIG. 7 illustrates a cross-sectional view of a package structure 1f according to some embodiments of the present disclosure. The package structure 1f is similar to the package structure 1 shown in FIG. 1, except that the protection layer 12 of the package structure 1 of FIG. 1 may be replaced by a bonding layer 17, and the conductive connecting element 13 of the package structure 1 of FIG. 1 may be omitted.

In some embodiments, the bonding layer 17 is disposed between the first conductive structure 2 and the second conductive structure 3, and bonding the second conductive structure 3 and the first conductive structure 2 together. In some embodiments, the bonding layer 17 has a top surface 171 and a bottom surface 172 opposite to the top surface 172. The top surface 171 is adhered to the first conductive structure 2, and the bottom surface 172 is adhered to the second conductive structure 3. In some embodiments, the bonding layer 17 further has a lateral peripheral surface 173 (also referred to as "a first lateral peripheral surface") extending between the top surface 171 and the bottom surface 172, and a lateral peripheral surface 174 (also referred to as "a second peripheral surface") opposite to the lateral peripheral surface 173. In some embodiments, the lateral peripheral surface 173 of the bonding layer 17 is substantially coplanar with the lateral peripheral surface 23 of the first conductive structure 2. In some embodiments, the lateral peripheral surface 174 of the bonding layer 17 is substantially coplanar with the lateral peripheral surface 24 of the first conductive structure 2.

In some embodiments, the package structure 1f further includes at least one interconnection via 19 extending through the core portion 30a and the dielectric structure 35 of the second conductive structure 3 and the bonding layer 17 for vertical connection. In some embodiments, each interconnection via 19 includes a base metallic layer 191 and an insulation material 192, and the insulation material 192 fills the central through hole defined by the base metallic layer 19. In some embodiments, each interconnection via 19 electrically connects the first conductive structure 2 and the conductive connecting element 18. In some embodiments, each interconnection via 19 electrically connects to the circuit layer 26 of the first conductive structure 2. In some embodiments, each interconnection via 19 may extend through the circuit layer 38a so as to electrically connect to the conductive connecting element 18 through the UBM 39.

FIG. 8 through FIG. 13 illustrate a method for manufacturing a package structure according to some embodiments of the present disclosure. In some embodiments, the method is for manufacturing the package structure 1 shown in FIG. 1.

Figure 8:
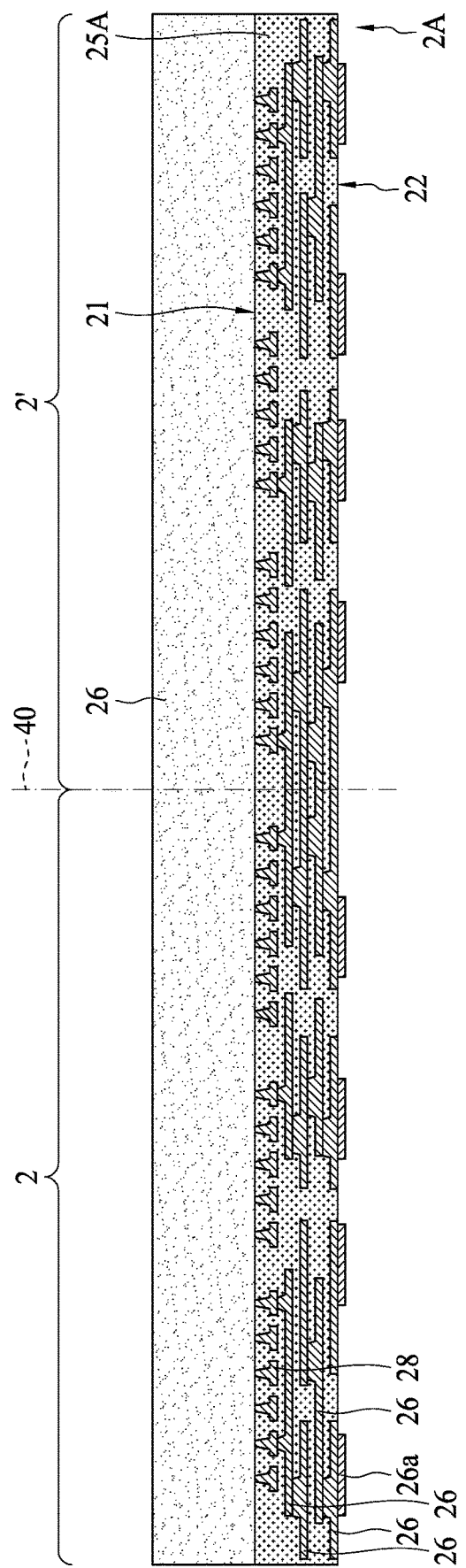
FIG. 8 illustrates one or more stages of an example of a method for manufacturing a package structure according to some embodiments of the present disclosure.

Referring to FIG. 8, a first conductive structure 2A is formed. The first conductive structure 2A includes a dielectric structure 25A and at least one circuit layer (including, for example, circuit layers 26 and 28 formed of a metal, a metal alloy, or other conductive material), the dielectric structure 25A includes at least one dielectric layer, and the at least one circuit layer is in contact with the at least one dielectric layer.

In some embodiments, as shown in FIG. 8, the first conductive structure 2A is formed on a carrier 26. In some embodiments, the first conductive structure 2A has a top surface 21 (also referred to as "a first surface") and a bottom surface 22 (also referred to as "a second surface") opposite to the top surface 21, and the top surface 21 of the first conductive structure 2A directly contacts the carrier 26. In some embodiments, a bonding pad 26a may be formed on the bottom surface 22 of the first conductive structure 2.

In some embodiments, the first conductive structure 2A further includes at least one unit. In some embodiments, the first conductive structure 2A includes a plurality of units 2, 2' defined by a plurality of imaginary cutting lines 40. For example, each of the units 2 and 2' may become the first conductive structure 2 of FIG. 1 after a cutting step. In some embodiments, the first conductive structure 2A may be in a wafer type, a panel type or a strip type.

In some embodiments, a functional testing step is conducted to the first conductive structure 2A. According to some embodiments of the present disclosure, the first conductive structure 2A is tested before being bonded to a second conductive structure 3 (will be discussed hereinafter); therefore, only a known good units 2, 2' may be selectively bonded to a second conductive structure 3. Any bad (or unqualified) unit 2, 2' may be discarded. Alternatively, the bad (or unqualified) unit 2, 2' may be marked and may be bonded to a dummy conductive structure. As a result, the yield of the package structure 1 may be improved.

Figure 9:
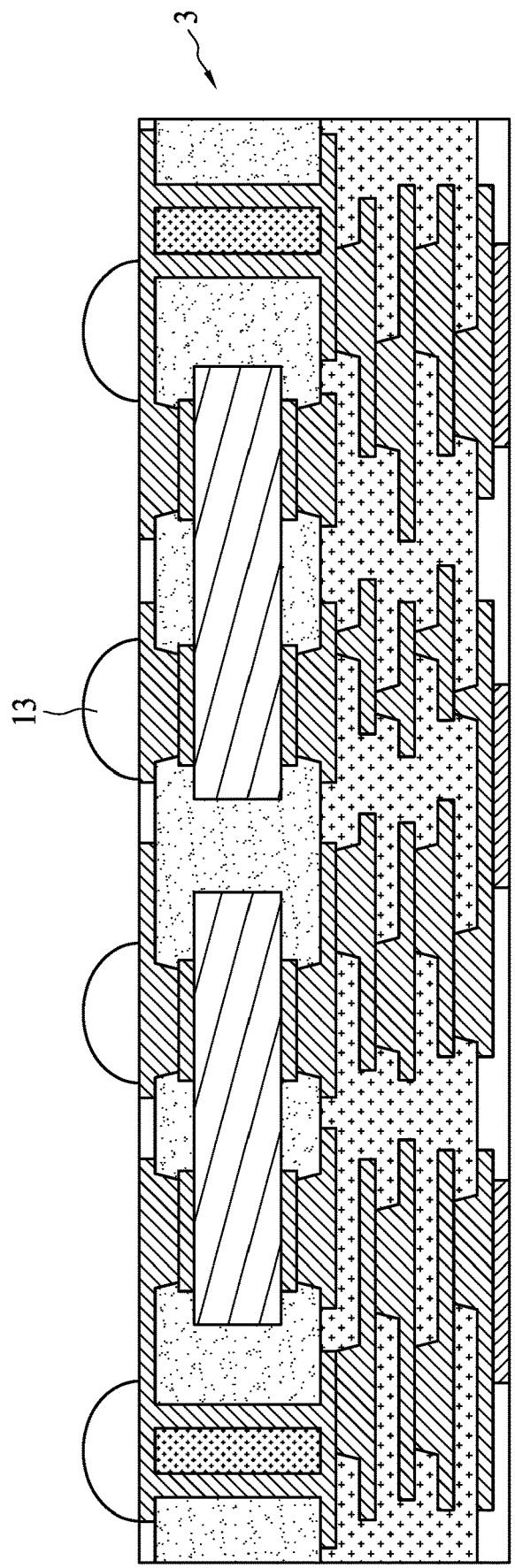
FIG. 9 illustrates one or more stages of an example of a method for manufacturing a package structure according to some embodiments of the present disclosure.

Referring to FIG. 9, at least one second conductive structure 3 is formed. The second conductive structure 3 includes a dielectric structure 35 and at least one circuit layer (including, for example, circuit layers 36, 36a, 38 and 38a formed of a metal, a metal alloy, or other conductive material). The dielectric structure 35 includes at least one dielectric layer, and the at least one circuit layer is in contact with the at least one dielectric layer. In some embodiments, a distribution density of the circuit layer of the first conductive structure 2A is greater than a distribution density of the circuit layer of the second conductive structure 3, and a size of the second conductive structure 3 is less than a size of the unit 2, 2' of the first conductive structure 2A. In some embodiments, forming at least one second conductive structure 3 includes forming a plurality of second conductive structures 3.

In some embodiments, the second conductive structure 3 may be a unit structure.

In some embodiments, a functional testing step is conducted to the second conductive structure 3. According to some embodiments of the present disclosure, the second conductive structure 3 and the first conductive structure 2A may be tested individually before being bonded together. Therefore, only known good second conductive structure 3 and known good unit 2, 2' of the first conductive structure 2A may be selectively bonded together. Bad (or unqualified)

second conductive structure 3 may be discarded. Alternatively, the bad (or unqualified) second conductive structure 3 may be bonded to the bad (or unqualified) unit 2, 2'. Thus, the bad (or unqualified) second conductive structure 3 with the bad (or unqualified) unit 2, 2' may be discarded after a cutting step. As a result, the yield of the package structure 1 may be further improved.

In some embodiments, the first conductive structure 2A and the second conductive structures 3 may be manufactured at the same time in different manufacturing places (for example, in different manufacturing chambers). As such, the overall time for manufacturing the package structure 1 can be significantly reduced.

Figure 10:
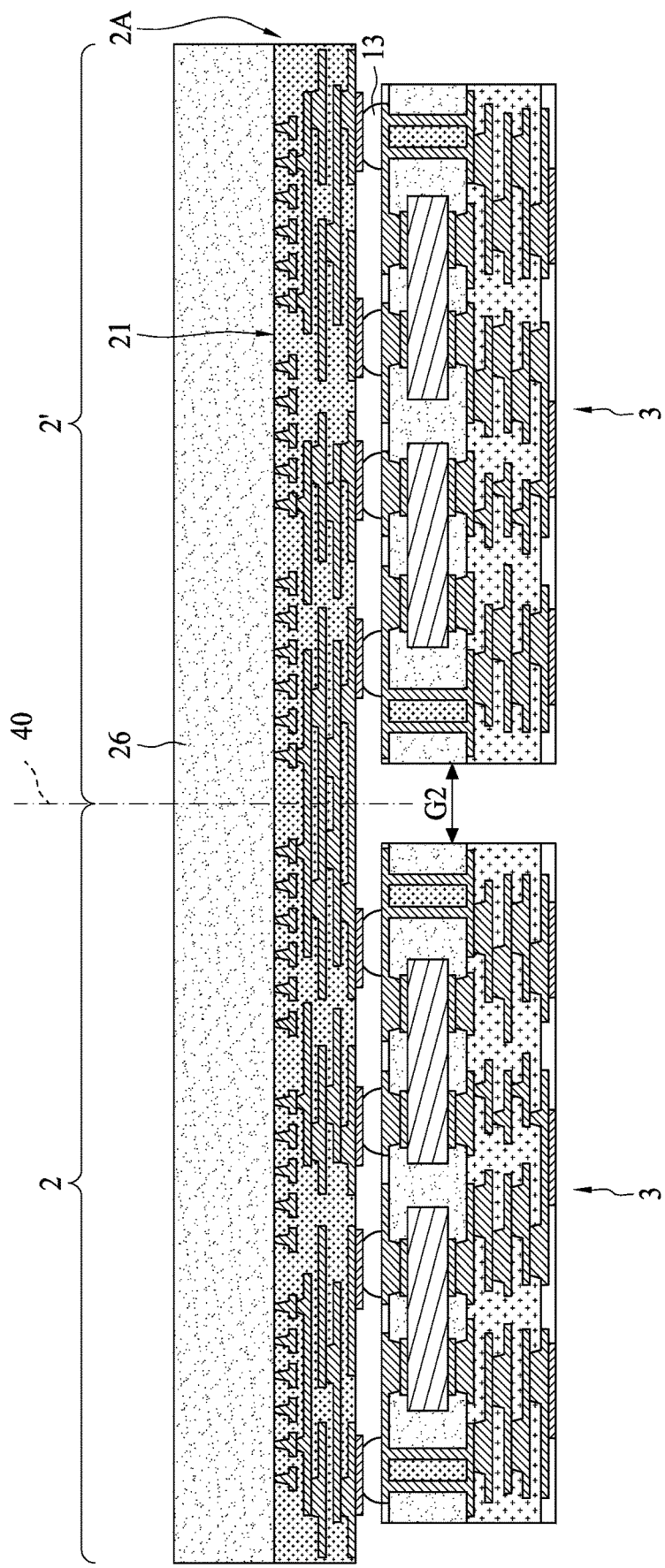
FIG. 10 illustrates one or more stages of an example of a method for manufacturing a package structure according to some embodiments of the present disclosure.

Referring to FIG. 10, the at least one second conductive structure 3 is bonded to the unit 2, 2' of the first conductive structure 2A. In some embodiments, the second conductive structures 3 are bonded to the first conductive structure 2A by solder joint technique. In some embodiments, at least one conductive connecting element 13 is between the first conductive structure 2A and the second conductive structures 3 to bond the first conductive structure 2A and the second conductive structures 3 together. In some embodiments, the conductive connecting element 13 may be or include C4 bumps, BGA, LGA, or the like.

In some embodiments, as shown in FIG. 10, the second conductive structures 3 are disposed on the first conductive structure 2A side by side, and a gap G2 between two second conductive structures 3 is less than about 150 μm. In some embodiments, the gap G2 between two second conductive structures 3 is less than about 100 μm.

Figure 10B:
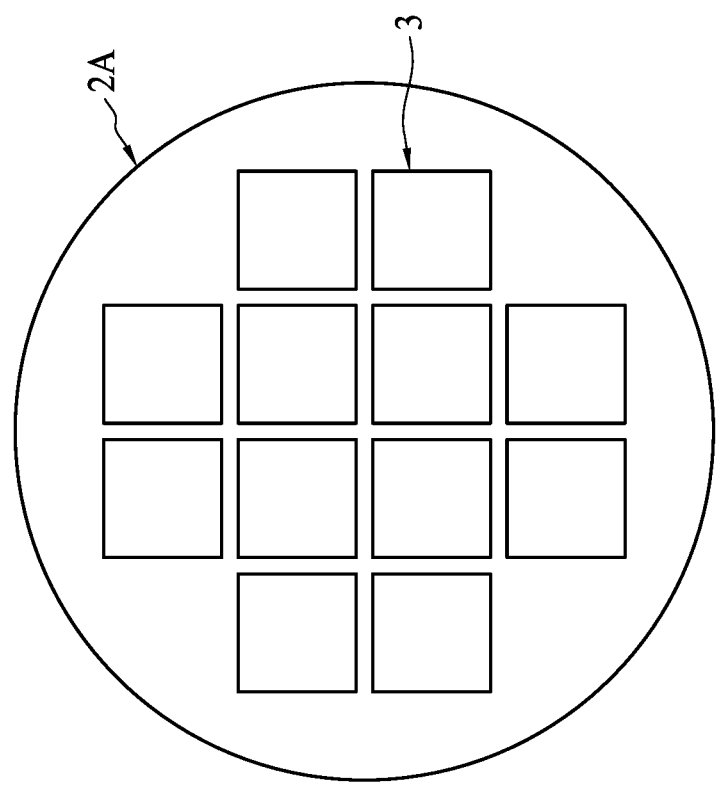
FIG. 10B illustrates a top view of one or more stages of an example of a method for manufacturing a package structure according to some embodiments of the present disclosure.
Figure 10A:
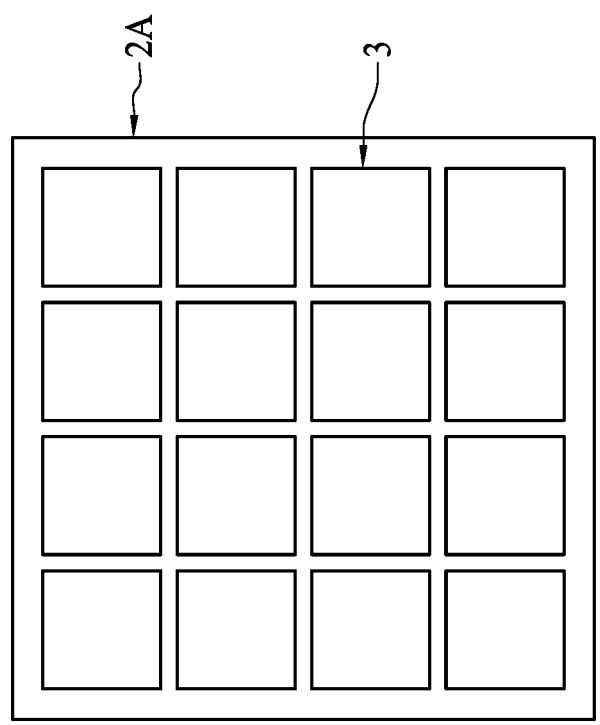
FIG. 10A illustrates a top view of one or more stages of an example of a method for manufacturing a package structure according to some embodiments of the present disclosure.

Referring to FIG. 10A and FIG. 10B, which illustrate top views of the arrangements of the second conductive structures 3 on the first conductive structure 2A after being bonded together. In some embodiments, the second conductive structures 3 may be arranged in an array including multiple columns and multiple rows of the second conductive structure 3. In some embodiments, every two adjacent second conductive structures 3 are separated by a gap (for example, gaps G2, G2a, G2b, G2c, G2d, G2e and G2f), and each of the gaps is less than about 150 μm. In some embodiments, each of the gaps is less than about 100 μm. In some embodiments, these gaps (for example, gaps G2, G2a, G2b, G2c, G2d, G2e and G2f) have the same size. In some embodiments, two or more of these gaps may be different from each other.

Figure 11:
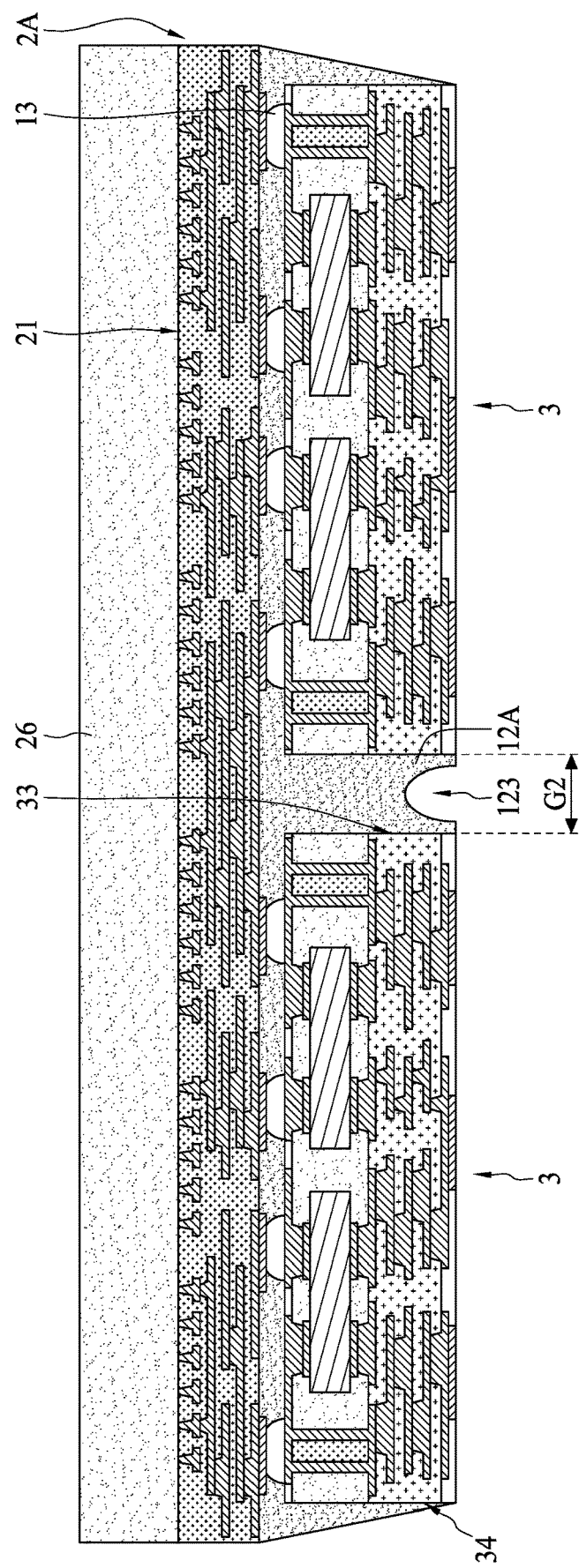
FIG. 11 illustrates one or more stages of an example of a method for manufacturing a package structure according to some embodiments of the present disclosure.

Referring to FIG. 11, a protection layer 12A is formed between the first conductive structure 2A and the second conductive structure 3. As shown in FIG. 11, in some embodiments, a portion of the protection layer 12A extends along a lateral peripheral surfaces 33, 34 of the second conductive structure 3. In some embodiments, the protection layer 12A may be formed by dispensing a flowable material between the first conductive structure 2A and the second conductive structures 3, and the flowable material is introduced into the gap G2 between the second conductive structures 3 by the capillary phenomenon. Thus, the protection layer 12A may be formed in the spaces between the first conductive structure 2 and the second conductive structures 3, and further formed in the gap G2 between the second conductive structures 3. In some embodiments, after the flowable material fills in the gap G2, a curing process may be conducted to the flowable material to form the cured protection layer 12A.

In the cases where the gap G2 is larger than 150 μm, the capillary force that drives the flowable material to be introduced into the gap G2 may be reduced. Thus, the flowable material or the protection layer 12A may not fill the gap G2, and a recess portion 123 may be recessed from a bottom surface of the flowable material or the protection layer 12A. On the other hands, in the cases where the gap G2 is too small (e.g., less than 150 μm), the space for the flowable material to flow into may be small. Thus, the flowable material or the protection layer 12A may fill the gap G2, or even protrude from and cover the bottom surfaces 32 of the second conductive structures 3. According to some embodiments of the present disclosure, the gap G2 between adjacent second conductive structures 3 being less than about 150 μm and/or about 100 μm is advantageous to the generation of the capillary phenomenon and thus facilitates the formation of the protection layer 12A between the second conductive structures 3.

In addition, in some embodiments, the second conductive structures 3 that are separate substrate units are bonded to the first conductive structure 2A that is in a wafer type, a panel type or a strip type, such that the gaps G2 are formed between every two second conductive structures 3. Therefore, the distance between every two adjacent gaps G2 is relatively short, the time is required for the flowable material to flow through the spaces between the first conductive structure 2 and the second conductive structures 3 and to reach the gaps G2 is reduced, and thus it is advantageous to the flowable material to flow in and fill the spaces between the first conductive structure 2 and the second conductive structures 3 and the gaps G2 between the second conductive structures 3.

Moreover, with the protection layer 12A disposed in the gaps G2 between the second conductive structures 3, since the protection layer 12A can enhance the structural strength of the bonded assembly structure shown in FIG. 11, and thus a singulation stage can be performed after the carrier 26 is removed from the first conductive structure 2A (which will be discussed hereinafter), the panel-type carrier 26 can be recycled, and thus the manufacturing cost can be reduced.

Furthermore, in the cases where substrate(s) and fan-out structure(s) are bonded together by an adhesion layer, and electrical connections between the substrate(s) and the fan-out structure(s) are conductive vias that are manufactured by laser technique, the I/O counts may be too low (for example, lower than 10000 I/O counts) due to the relatively large sizes (e.g., 50-60 μm or above) of the conductive vias formed by laser technique. Further, the laser drilling process may be costly. According to some embodiments of the present disclosure, the first conductive structure 2A and the second conductive structures 3 are bonded together by solder joint technique (for example, using the conductive connecting elements 13), such that the manufacture of conductive vias by such laser technique may be omitted, and thus the low I/O density (low I/O counts) issue due to the relatively large sizes of the conductive vias formed by laser technique may be greatly improved.

In some embodiments, before the carrier 26 is removed (which will be discussed hereinafter), a functional test may be conducted to the bonded assembly structure. In some embodiments, the second conductive structures 3 and the first conductive structure 2A may be tested individually before semiconductor devices 15 are bonded to the bonded assembly structure (which will be discussed hereinafter), and then a sorting step is conducted to the tested bonded assembly structure. In some embodiments, a bad (or unqualified) unit (including a second conductive structure 3 and a unit 2, 2' of the first conductive structure 2A) of the bonded assembly structure may be marked in the sorting step.

Figure 12:
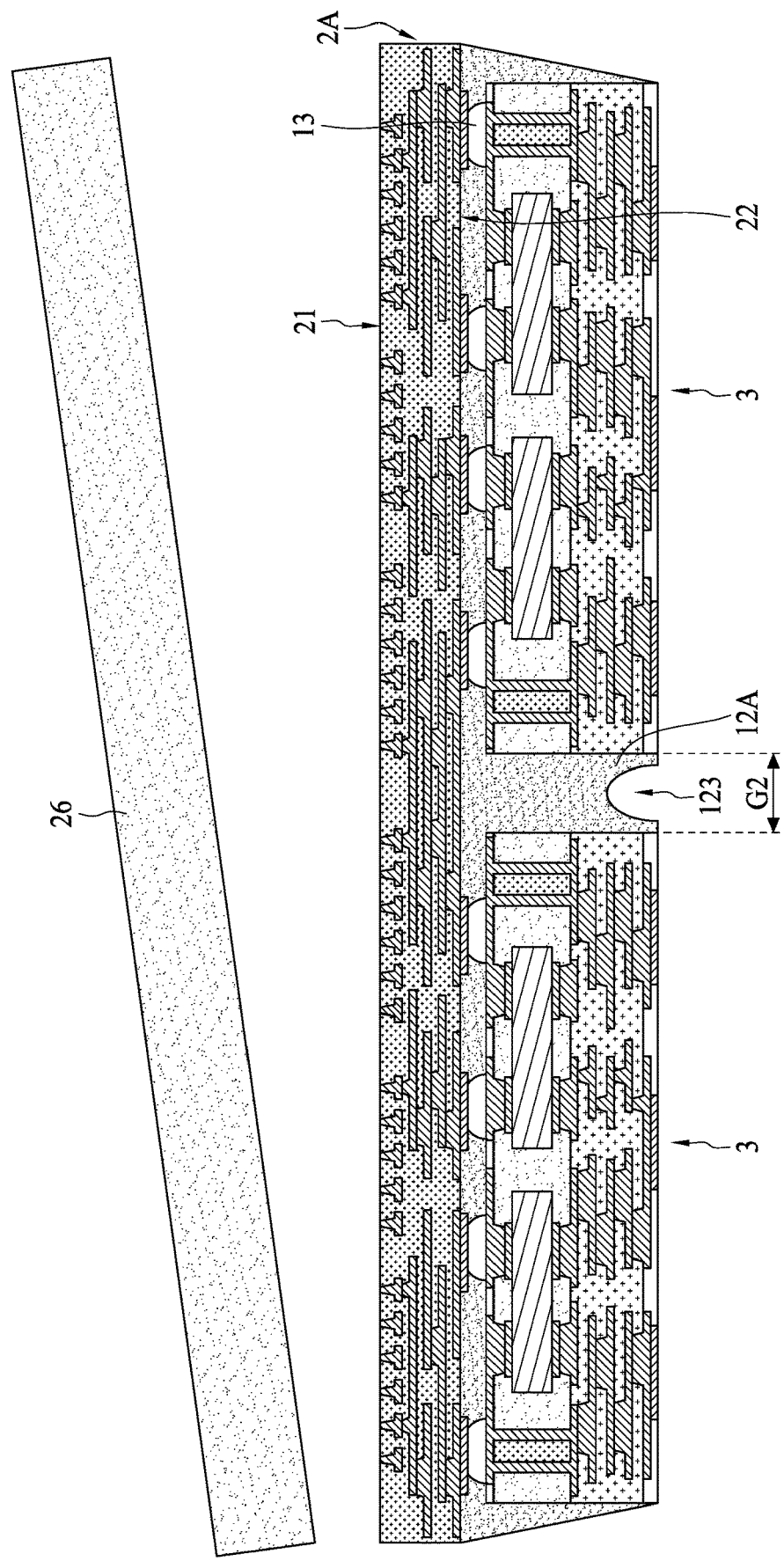
FIG. 12 illustrates one or more stages of an example of a method for manufacturing a package structure according to some embodiments of the present disclosure.

Referring to FIG. 12, the carrier 26 is removed. In some embodiments, the top surface 21 of the first conductive structure 2A is exposed after the carrier 26 is removed.

Figure 13:
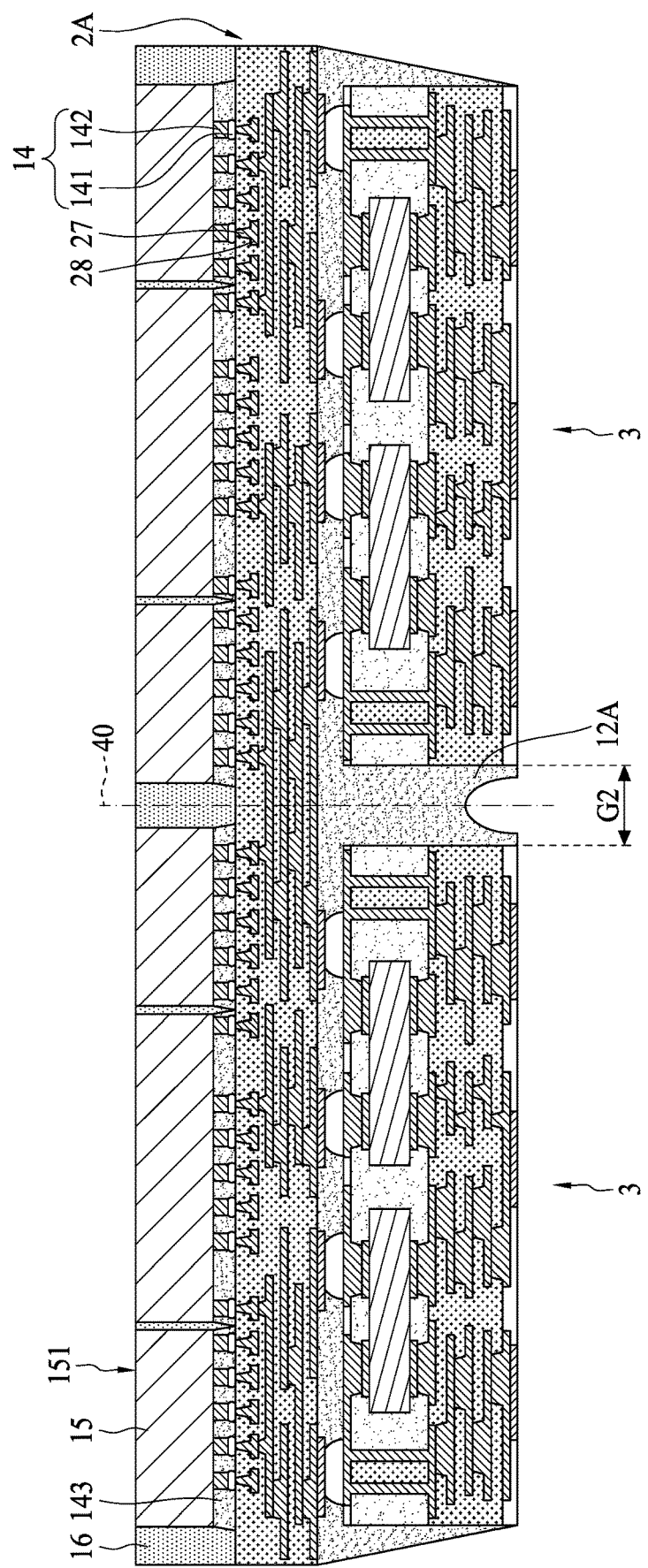
FIG. 13 illustrates one or more stages of an example of a method for manufacturing a package structure according to some embodiments of the present disclosure.

Referring to FIG. 13, at least one semiconductor device 15 is electrically connected to the top surface 21 of the first conductive structure 2A. In some embodiments, at least one solder 141 is formed on at least one bump 142 of the semiconductor device 15, and then the semiconductor device 15 is bonded to the exposed inner via 27 of the first conductive structure 2A through the at least one solder 141. An underfill 143 may be formed to cover and protect the at least one bump 142 and the at least one solder 141. Next, an encapsulant 16 may be formed to cover the at least one semiconductor device 15 and the underfill 143, and then a planarization process may be conducted to partially remove the encapsulant 16 and expose the top surface 151 of the at least one semiconductor device 15.

In some embodiments, the at least one semiconductor device 15 is electrically connected to the known good unit 2, 2' of the first conductive structure 2A and known good second conductive structure 3 (i.e., a good (or qualified) unit of the bonded assembly structure in the sorting step). Further, at least one dummy semiconductor device may be connected to the marked bad (or unqualified) unit of the bonded assembly structure. Therefore, known good semiconductor devices 15 are not wasted, the overall structural balance can be maintained, and the yield of the package structure 1 can be further improved.

Then, a cutting step (also referred to as "a singulation stage") is conducted to the first conductive structure 2A. In some embodiments, the cutting step is conducted along the cutting line 40 between the adjacent second conductive structures 3. In some embodiments, the cutting step is conducted to the protection layer 12A in the gap G2 between the adjacent second conductive structures 3. In some embodiments, the cutting step separates the units 2, 2' of the first conductive structure 2A. As such, the package structure 1 of FIG. 1 is obtained.

In a comparative embodiment, a singulation stage is conducted on a bonded assembly structure with a panel-type glass carrier attached thereon, delamination may easily occur. In addition, after the panel-type glass carrier is cut into units, the removed glass carrier units cannot be recycled, and thus the manufacturing cost is undesirably increased. According to some embodiments of the present disclosure, the cutting step is performed on the first conductive structure 2A and the protection layer 12A after the carrier 26 is removed, such that delamination caused by cutting of the carrier 26 can be effectively prevented, and the carrier 26 can be recycled, which significantly reduces the manufacturing cost and increases the yield.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a first conductive structure including at least one dielectric layer and at least one circuit layer in contact with the dielectric layer; and
   a second conductive structure bonded to the first conductive structure, the second conductive structure including at least one dielectric layer and at least one circuit layer in contact with the dielectric layer;
   wherein a distribution density of the circuit layer of the first conductive structure is greater than a distribution density of the circuit layer of the second conductive structure, and a size of the second conductive structure is less than a size of the first conductive structure; and
   wherein the first conductive structure comprises an inner via, the inner via has a first opening and a second opening opposite to the first opening, the second conductive structure is closer to the first opening than to the second opening, and a width of the first opening is greater than a width of the second opening.

2. The package structure as claimed in claim 1, wherein a gap between a lateral peripheral surface of the second conductive structure and a lateral peripheral surface of the first conductive structure is equal to or less than 75 μm.

3. The package structure as claimed in claim 1, further comprising:
   at least one conductive connecting element disposed between the second conductive structure and the first conductive structure and bonding the second conductive structure and the first conductive structure together.

4. The package structure as claimed in claim 1, further comprising:
   a protection layer disposed between the first conductive structure and the second conductive structure, wherein the protection layer includes a portion contacting a first lateral peripheral surface of the second conductive structure.

5. The package structure as claimed in claim 1, further comprising:
   at least one semiconductor device electrically connected to the first conductive structure, wherein the at least one semiconductor device is closer to the first conductive structure than the second conductive structure is.

6. The package structure as claimed in claim 4, further comprising:
   an encapsulant encapsulating at least one semiconductor device electrically connected to the first conductive structure, wherein a lateral peripheral surface of the portion of the protection layer is substantially coplanar with a lateral peripheral surface of the encapsulant.

7. A package structure, comprising:
   a first conductive structure including at least one dielectric layer and at least one circuit layer in contact with the dielectric layer;
   a second conductive structure bonded to the first conductive structure, the second conductive structure including at least one dielectric layer and at least one circuit layer in contact with the dielectric layer, wherein a distribution density of the circuit layer of the first conductive structure is greater than a distribution density of the circuit layer of the second conductive structure;
   a protection layer between the first conductive structure and the second conductive structure, wherein a portion of the protection layer contacts a lateral peripheral surface of the second conductive structure and has a width increasing along a direction towards the first conductive structure; and
   a semiconductor device electrically connected to the first conductive structure, wherein the semiconductor device is closer to the first conductive structure than the second conductive structure is.

8. The package structure as claimed in claim 7, wherein the portion of the protection layer directly contacts the lateral peripheral surface of the second conductive structure at an interface, and a ratio of a length of the interface to a length of the lateral peripheral surface of the second conductive structure is greater than 0.8.

9. The package structure as claimed in claim 7, wherein the second conductive structure has a first surface facing the first conductive structure and a second surface opposite to the first surface, and the portion of the protection layer partially covers the second surface of the second conductive structure.

10. The package structure as claimed in claim 7, wherein the second conductive structure has a first surface facing the first conductive structure and a second surface opposite to the first surface, the second conductive structure further includes a solder mask adjacent to the second surface of the second conductive structure, and the portion of the protection layer directly contacts the solder mask.

11. The package structure as claimed in claim 10, wherein the solder mask is recessed from the lateral peripheral surface of the second conductive structure.

12. A method for manufacturing a package structure, comprising:
   (a) forming a first conductive structure including at least one dielectric layer and at least one circuit layer in contact with the dielectric layer, wherein the first conductive structure further includes at least one unit;
   (b) forming at least one second conductive structure including at least one dielectric layer and at least one circuit layer in contact with the dielectric layer, wherein a distribution density of the circuit layer of the first conductive structure is greater than a distribution density of the circuit layer of the second conductive structure, and a size of the second conductive structure is less than a size of the unit of the first conductive structure;
   (c) bonding the at least one second conductive structure to the unit of the first conductive structure; and
   (e) electrically connecting at least one semiconductor device to the first conductive structure, wherein the at least one semiconductor device is closer to the first conductive structure than the second conductive structure is.

13. The method as claimed in claim 12, wherein after (c), the method further comprises:
   (d) forming a protection layer between the first conductive structure and the second conductive structure, wherein a portion of the protection layer extends along a lateral peripheral surface of the second conductive structure.

14. The method as claimed in claim 12, wherein after (a), the method further comprises:
   (a1) conducting a functional testing step to the first conductive structure;
   and after (b), the method further comprises:
   (b1) conducting a functional testing step to the second conductive structure.

15. The package structure as claimed in claim 4, wherein the portion of the protection layer has a width increasing along a direction towards the first conductive structure.

16. The package structure as claimed in claim 5, wherein an active surface of the at least one semiconductor device is facing the first conductive structure.

17. The package structure as claimed in claim 16, further comprising:
   an underfill between the at least one semiconductor device and the first conductive structure.

18. The package structure as claimed in claim 5, further comprising:
   an encapsulant encapsulating the at least one semiconductor device, wherein a lateral peripheral surface of the encapsulant is substantially coplanar with a lateral peripheral surface of the first conductive structure.

19. The package structure as claimed in claim 5, further comprising an electronic device in the second conductive structure and electrically connected to the at least one semiconductor device.

20. The package structure as claimed in claim 1, wherein a thickness of the first conductive structure is less than a thickness of the second conductive structure.

21. The package structure as claimed in claim 7, wherein an active surface of the semiconductor device is facing the first conductive structure.

22. The package structure as claimed in claim 21, further comprising:
   an underfill between the semiconductor device and the first conductive structure.

23. The package structure as claimed in claim 7, further comprising:
   an encapsulant encapsulating the semiconductor device, wherein a lateral peripheral surface of the encapsulant is substantially coplanar with a lateral peripheral surface of the first conductive structure.

24. The package structure as claimed in claim 7, further comprising an electronic device in the second conductive structure and electrically connected to the semiconductor device.

* * * * *